United States Patent [19]
Matsuzaki et al.

[11] Patent Number: 5,493,136
[45] Date of Patent: Feb. 20, 1996

[54] FIELD EFFECT TRANSISTOR AND METHOD OF MANUFACTURING THE SAME

[75] Inventors: Ken-ichiro Matsuzaki; Shigeru Nakajima; Nobuhiro Kuwata; Kenji Otobe; Nobuo Shiga; Ken-ichi Yoshida, all of Yokohama, Japan

[73] Assignee: Sumitomo Electric Industries, Ltd., Osaka, Japan

[21] Appl. No.: 197,597

[22] Filed: Feb. 17, 1994

[30] Foreign Application Priority Data

Feb. 22, 1993 [JP] Japan .................................. 5-032172
Feb. 26, 1993 [JP] Japan .................................. 5-038294

[51] Int. Cl.$^6$ ............................................ H01L 29/80
[52] U.S. Cl. ...................... 257/287; 257/194; 257/285; 257/401; 257/657
[58] Field of Search ............................ 257/287, 401, 257/655, 657, 194, 285

[56] References Cited

U.S. PATENT DOCUMENTS 4,163,984 8/1979 Pucel ................................. 357/22

FOREIGN PATENT DOCUMENTS

| | | |
|---|---|---|
| 0309290 | 3/1989 | European Pat. Off. . |
| 0492666 | 7/1992 | European Pat. Off. . |
| 61-252665 | 11/1986 | Japan . |
| 2-299273 | 12/1990 | Japan . |
| 4-245646 | 9/1992 | Japan . |

OTHER PUBLICATIONS

"A 760mS/mm N+Self–Aligned Enhancement Mode Doped–Channel Mis–Like FET (DMT)", H. Hida et al., 1986 IEEE, p. 759.

R. B. Beall et al., "Post–growth Diffusion Of Si in δ–doped GaAs Grown By MBE", Semiconductor Science and Technology, 4 (1989), pp. 1171–1175.

Z. Abid et al., "GaAs MESFETs With Channel–Doping Variations", Solid–State Electronics 34, No. 12, Dec. (1991), pp. 1427–1432.

K. Ploog et al., "The Use Of Si And Be Impurities For Novel Periodic Doping Structures In GaAs Grown By Molecular Beam Epitaxy", Solid–State Science And Technology, vol. 128, No. 2, Feb. (1981), pp. 400–410.

*Primary Examiner*—Mark V. Prenty
*Attorney, Agent, or Firm*—Beveridge, DeGrandi, Weilacher & Young

[57] ABSTRACT

This invention provides a high-speed FET with a sufficiently high output current, and an FET having a high mobility of channel electrons and a high electron saturation rate. For this purpose, in this invention, a buffer layer, a first channel layer, a first spacer layer, a second channel layer, a second spacer layer, a third channel layer, and a capping layer are sequentially epitaxially grown on a semi-insulating GaAs semiconductor substrate. Drain and source regions are formed, and a gate electrode is formed to Schottky-contact the capping layer. Drain and source electrodes are formed to ohmic-contact the drain and source regions. Extension of a surface depletion layer from the substrate surface to a deep portion is prevented by the third channel layer closest to the substrate surface. For this reason, a sufficient quantity of electrons for forming a current channel are assured by the second and first channel layers.

13 Claims, 6 Drawing Sheets

FIELD EFFECT TRANSISTOR AND METHOD OF MANUFACTURING THE SAME

BACKGROUND OF THE INVENTION

1. Field of the Invention

The present invention relates to the structure of a field effect transistor (FET) which can realize ultra high-speed operation, and a method of manufacturing the same.

2. Related Background Art

Conventionally, an FET which can realize an ultra high-speed operation, in which an active layer for forming a current channel adopting a so-called pulse-doped structure is known. In the FET with the pulse-doped structure, the impurity profile of the active layer reveals an undoped state from the substrate surface to a predetermined depth. However, the impurity concentration changes in a pulse-like pattern or stepwise to a high concentration at the predetermined depth from the substrate surface, and the impurity profile returns to an undoped state at a deeper substrate position. Such an FET with the pulse-doped structure is described in, e.g., U.S. Pat. No. 4,163,984 or in p. 759 of the following reference:

1986 IEEE IEDM "A 760 mS/mm N$^+$SELF-ALIGNED ENHANCEMENT MODE DOPED-CHANNEL MIS-LIKE FET(DMT)"

However, in such an FET with the pulse-doped structure, a sufficient quantity of electrons for forming a current channel cannot be assured. For this reason, another patent application (Japanese Patent Laid-Open No. 4-245646) by the present applicant proposed an FET having a pulse-doped structure in which two active layers are formed. With this FET, since the two active layers are formed, the quantity of electrons for forming a current channel increases, and a high current output can be realized.

However, in the conventional FET with the structure including two active layers, when a long gate effect occurs due to a surface depletion layer in the drain electrode side, the effective gate length increases, and the active layer formed on the surface side of the substrate is depleted. When the active layer is depleted, the flow of channel electrons is hindered, and the total quantity of electrons for forming a current channel decreases. As a result, a high current output cannot often be obtained in the conventional FET with the above-mentioned structure.

In the conventional FET with the pulse-doped structure described in the above-mentioned U.S. Patent, electrons for forming a channel move in an active layer with a high impurity concentration in a low electric field region. For this reason, electrons are considerably influenced by impurity scattering, and the electron mobility in a low electric field region is lowered. As a result, the high-frequency operation characteristics of an element cannot be improved. A transconductance $g_m$ which represents the rate of change in drain current with respect to a change in gate voltage cannot hold a constant value over a given range with respect to a change in gate voltage.

SUMMARY OF THE INVENTION

The present invention has been made to solve the above-mentioned problems, and has as its object to provide an FET using a thin-film semiconductor layer having a high impurity concentration as a channel layer, wherein the channel layer is formed with three or more above semiconductor layers to sandwich an undoped layer between each two adjacent semiconductor layers.

In an FET with the structure of the present invention, extension of a surface depletion layer from the substrate surface to a deep portion is disturbed by the semiconductor layer closest to the substrate surface. Three or more semiconductor layers constituting the channel layer are formed to sandwich an undoped layer between each two adjacent semiconductor layers, and a plurality of semiconductor layers are formed in a semiconductor substrate position deeper than the semiconductor layer closest to the substrate surface. For this reason, even when the semiconductor layer closest to the substrate surface is depleted, a sufficient quantity of electrons for forming a current channel can be assured.

According to the present invention, in an FET using a thin-film semiconductor layer having a high impurity concentration as a channel layer, a plurality of above semiconductor layers constituting the channel layer are formed to sandwich an undoped layer between each two adjacent semiconductor layers, a doping layer is formed on a semiconductor layer, closest to the substrate surface, of these semiconductor layers via an undoped layer, and the doping layer has a predetermined impurity concentration and thickness so as to prevent a surface depletion layer from spreading to the channel layer.

In this manner, when the doping layer having the predetermined impurity concentration and thickness is formed on the channel layer closest to the substrate surface, extension of the surface depletion layer from the substrate surface to a deep portion is disturbed by the doping layer formed on the channel layer. Since the plurality of semiconductor layers constituting the channel layer are formed below the doping layer, a sufficient quantity of electrons for forming a current channel can be assured.

For this reason, in the FET with the structure according to the present invention, a sufficient quantity of electrons for forming a current channel can be assured by the plurality of semiconductor layers constituting the channel layer. Therefore, a sufficiently high output current is maintained without being influenced by a surface depletion layer, and an FET which can realize a high-output, high-speed operation can be provided.

According to the present invention, in an FET using a thin-film semiconductor layer having a high impurity concentration as a channel layer, a plurality of semiconductor layers are formed to constitute the channel layer, and an intermediate concentration layer having a lower impurity concentration than that of the semiconductor layers is formed between each two adjacent semiconductor layers.

In the FET in which the intermediate concentration layer is formed between each two adjacent ones of the plurality of semiconductor layers, since the intermediate concentration layer has a low impurity concentration, channel electrons are also generated by an impurity present in the intermediate concentration layer. Therefore, electrons for forming a current channel are distributed in the intermediate concentration layer between each two adjacent semiconductor layers even in a low electric field region, and move in the intermediate concentration layer having a lower impurity concentration than that of the semiconductor layers forming the channel.

For this reason, the mobility of channel electrons in the low electric field region increases, and a high electron saturation rate is maintained, thus improving the high-frequency characteristics of an element. Also, a transconductance $g_m$ can hold a constant value over a given range with respect to a change in gate voltage.

According to the present invention, a method of manufacturing an FET in which a channel layer is formed by the step of forming an undoped layer, the step of forming a thin-film semiconductor layer having a high impurity concentration on the undoped layer, and the step of forming an undoped layer on the semiconductor layer, comprises the step of forming the channel layer by forming a plurality of the semiconductor layers sandwiched between the undoped layers by repeating the step of forming the undoped layer and the step of forming the semiconductor layer, and the step of forming an intermediate layer by diffusing an impurity contained in the semiconductor layers to the undoped layers by performing annealing after these steps.

When the intermediate concentration layer is formed by annealing, layers which sandwich the plurality of semiconductor layers at the outermost sides contain an impurity at a low concentration, and channel electrons are distributed to the two outermost layers as well. Therefore, channel electrons move in the two outermost layers having a low impurity concentration in addition to the intermediate concentration layer.

For this reason, the mobility of channel electrons in a low electric field region can be further increased, and the high-frequency characteristics of an element can be further improved.

Also, according to the present invention, a method of manufacturing an FET comprises the step of forming an intermediate concentration layer, the step of forming a thin-film semiconductor layer having a high impurity concentration on the intermediate concentration layer, and the step of forming an intermediate concentration layer on the semiconductor layer, wherein the intermediate concentration layer is formed to have an impurity concentration lower than that by the semiconductor layer by a crystal growth method in which an impurity concentration is controlled, and the channel layer is formed by forming a plurality of the semiconductor layers each of which is sandwiched between the intermediate concentration layers by repeating the step of forming the intermediate concentration layer and the step of forming the semiconductor layer.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form the detailed description.

DETAILED DESCRIPTION OF THE PREFERRED EMBODIMENTS

Figure 1:
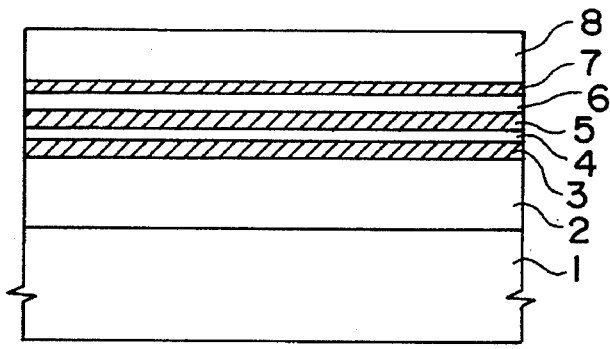
FIGS. 1 to 3 are sectional views showing the processes in the manufacture of an FET according to the first embodiment of the present invention.
Figure 2:
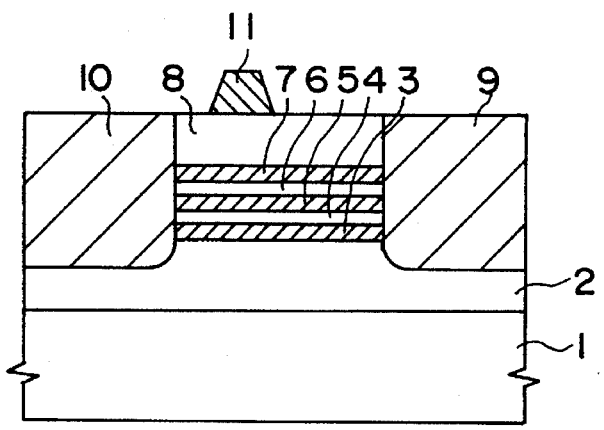
Figure 3:
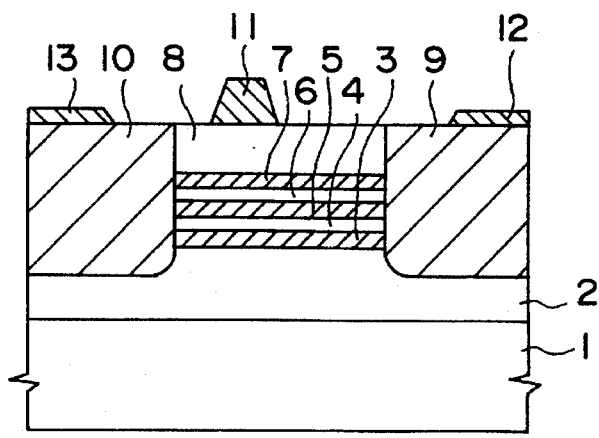

FIGS. 1 to 3 are sectional views showing the method of manufacturing an FET according to the first embodiment of the present invention.

Semiconductor layers (to be described below) are sequentially deposited on a semi-insulating GaAs semiconductor substrate 1 by an epitaxy technique such as an MBE (Molecular Beam Epitaxy) method, an OMVPE (Organic Metal Vapor phase Epitaxy) method, or the like. An undoped GaAs buffer layer 2 is epitaxially grown on the GaAs substrate 1. When the FET is formed by the OMVPE method, the buffer layer 2 is set to be an undoped layer having p⁻ background conductivity type by controlling the supply ratio of Ga as a Group-III material and As as a Group-V material. The impurity concentration of the layer 2 is suppressed to as low as $5\times10^{16}$ [cm⁻³] or less.

Then, an Si-doped GaAs layer is epitaxially grown on the buffer layer 2 to form a first channel layer 3 as a first semiconductor layer. The first channel layer 3 contains Si ions as an n-type impurity at a high concentration of about $3\times10^{18}$ [cm⁻³], and has a thickness as small as 80 Å. Subsequently, a 50-Å thick first spacer layer 4 consisting of undoped GaAs is epitaxially grown on the first channel layer 3. The background conductivity type of the first spacer layer 4, when the FET is formed by the OMVPE method, is n⁻ type, and its impurity concentration is suppressed to as low as $5\times10^{15}$ [cm⁻³] or less. Note that, when the FET is formed by the MBE method, the background conductivity type of the first spacer layer 4 is p⁻ type.

Furthermore, a second channel layer 5 as a second semiconductor layer, a second spacer layer 6, a third channel layer 7 as a third semiconductor layer, and a capping layer 8 are sequentially epitaxially grown on the first spacer layer 4 (see FIG. 1). These second and third channel layers 5 and 7 are formed by using Si-doped GaAs having the same impurity concentration as that of the first channel layer 3 to have thicknesses of 70 Å and 80 Å, respectively. The second spacer layer 6 is formed using the same undoped GaAs as in the first spacer layer 4 to have the same thickness as that of the layer 4. The capping layer 8 is formed using the same undoped GaAs as in the spacer layers 4 and 6. In this case, the capping layer 8 is formed to have a thickness, i.e., a depth, from the substrate surface to the third channel layer 7, of 400 Å.

A source drain region pattern is formed on the substrate surface using a lithography technique, and high-concentration Si ions are selectively ion-implanted using this pattern as a mask. By this selective ion implantation, an n⁺-type drain region 9 and an n⁺-type source region 10 are formed. Then, a gate electrode 11 is formed using, e.g., a deposition technique, lithography technique, etching technique, and the like ( see FIG. 2 ). The gate electrode 11 is formed at a position separated away from the drain region 9.

Finally, a drain electrode 12 and a source electrode 13, which respectively ohmic-contact the drain region 9 and the source region 10, are formed using a similar deposition technique, lithography technique, and the like. Upon formation of these electrodes, a Schottky contact type FET (MESFET) is completed (see FIG. 3).

Figure 4:
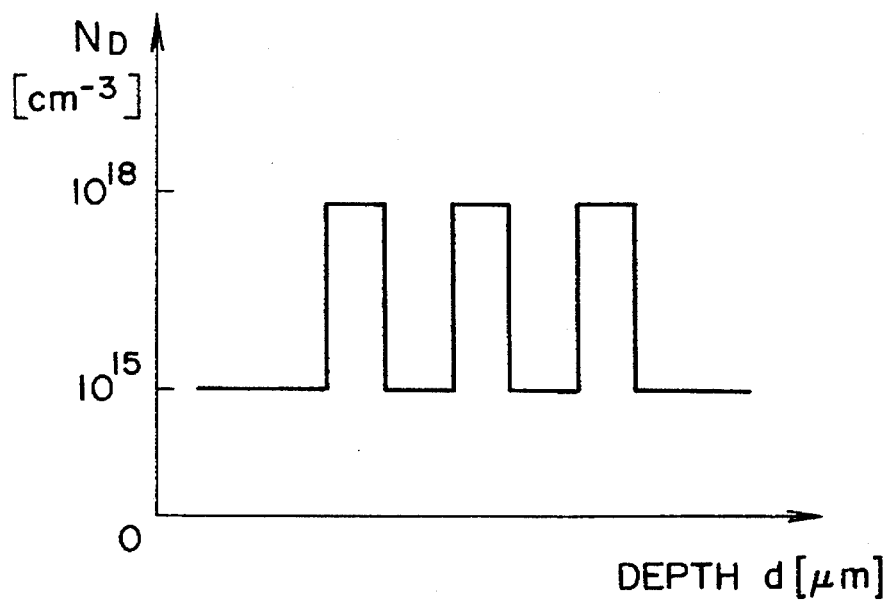
FIG. 4 is a graph showing the impurity profile below the gate electrode of the FET according to the first embodiment.

The impurity profile below the gate electrode 11 of this embodiment is as shown in the graph in FIG. 4. The abscissa of the graph in FIG. 4 represents a depth d [μm] from the substrate surface, and the ordinate represents a concentration $N_D$ [cm⁻³] of an n-type impurity, Si. In this impurity profile, the impurity concentration locally increases in a pulse pattern. A pulse-pattern portion near the substrate surface represents a profile corresponding to the third channel layer 7 having a high impurity concentration, a pulse-pattern portion adjacent to this represents a profile corresponding to the second channel layer 5 having a high impurity concentration, and a pulse-pattern portion in the substrate deep portion represents a profile corresponding to the first channel layer 3.

In the FET of this embodiment, even when a surface depletion layer is formed due to the interface level of the substrate surface on the side of the drain electrode 12, extension of the surface depletion layer to a deeper portion in the substrate is prevented by the third channel layer 7 closest to the substrate surface side. The two channel layers, i.e., the second and first channel layers 5 and 3 are formed at substrate positions deeper than the third channel layer 7. Therefore, even when electrons moving in the third channel layer 7 are shielded by the surface depletion layer, a sufficient quantity of channel electrons are assured by the impurity present in the second and first channel layers 5 and 3 at a high concentration.

More specifically, when a low electric field is applied across the drain source path, a part of a large quantity of electrons generated in the plurality of channel layers 5 and 3 are present with a high probability in the second and first spacer layers 6 and 4 and the buffer layer 2 as undoped layers with good electron transfer characteristics. For this reason, many electrons move along the source drain path at high speed without being influenced by impurity scattering. When a high electric field is applied across the drain.source path, more electrons constituting the channel acquire a higher energy level and move into the undoped spacer layers 6 and 4 and the undoped buffer layer 2, which sandwich the channel layers 5 and 3 therebetween and have good electron transfer characteristics. For this reason, again, a large quantity of electrons move across the drain.source path without being influenced by impurity scattering. As a result, as compared with a conventional FET formed with only two channel layers, the probability of the presence of carriers in the spacer layers 6 and 4 and the buffer layer 2 with good electron transfer characteristics increases, and a sufficiently high output current is maintained without being influenced by the surface depletion layer. Therefore, a problem of a low current output is not posed unlike in the conventional FET.

The characteristics of the FET with the pulse-doped structure according to this embodiment in which a channel layer is formed by arranging three thin-film semiconductor layers having a high impurity concentration, will be compared below with those of a conventional FET with a pulse-doped structure in which only one semiconductor layer is formed in a channel layer.

Figure 5:
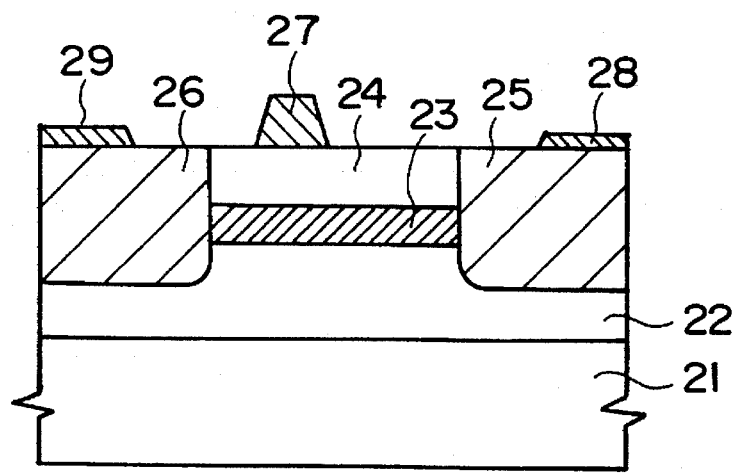
FIG. 5 is a sectional view showing a conventional FET having a single-channel structure to be compared with the FET of the first embodiment so as to show effects of the FET of the first embodiment.

The conventional FET with the pulse-doped structure has a sectional structure shown in FIG. 5. More specifically, an undoped GaAs buffer layer 22 of p⁻ background conductivity type is formed on a semi-insulating GaAs semiconductor substrate 21. A channel layer 23 containing an Si impurity at a high concentration is formed on the buffer layer 22. The impurity concentration of the channel layer 23 is 3×10¹⁸ [cm⁻³], and its thickness is 230 Å. Furthermore, a 400-Å thick capping layer 24 consisting of an undoped GaAs layer of n⁻ background conductivity type is formed on the channel layer 23. An n⁺-type drain region 25 and an n⁺-type source region 26 are formed to sandwich the channel layer 23 therebetween, a gate electrode 27 is formed to Schottky-contact the capping layer 24, and drain and source electrodes 28 and 29 are formed to ohmic-contact the drain and source regions 25 and 26.

Figure 6:
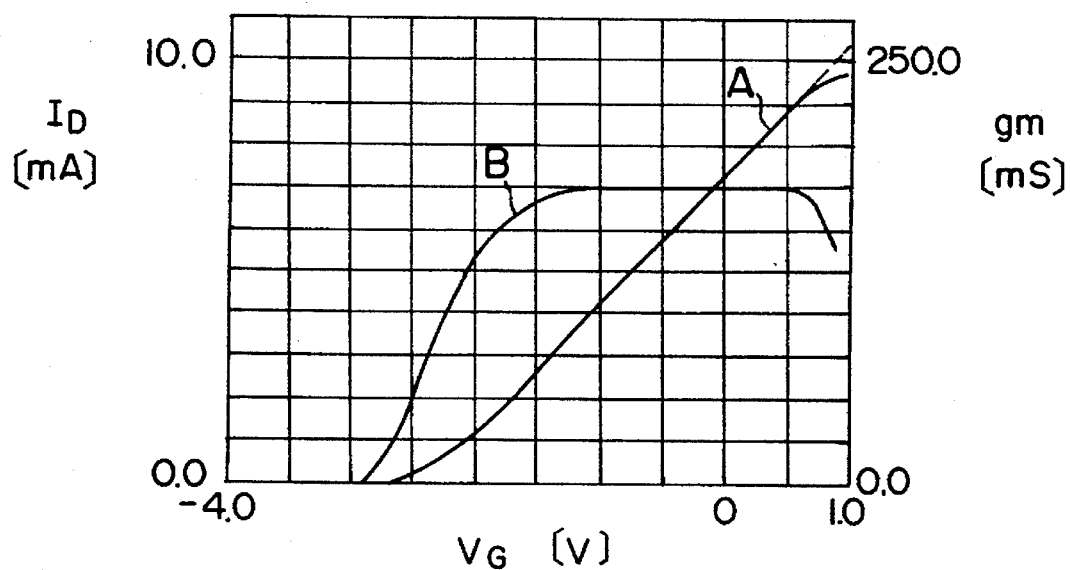
FIG. 6 is a graph showing the characteristics of the FET of the first embodiment.
Figure 7:
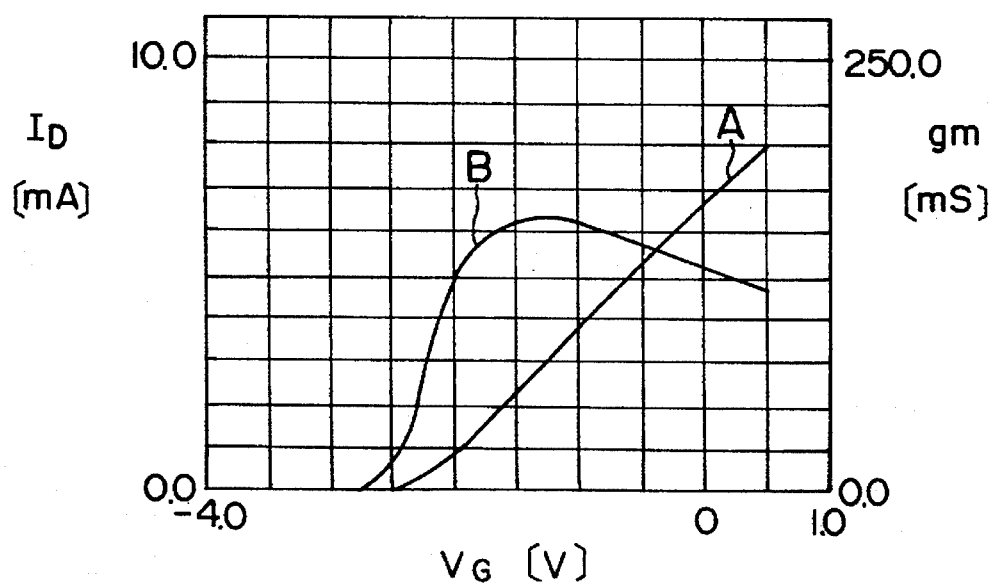
FIG. 7 is a graph showing the characteristics of the conventional FET shown in FIG. 5.

FIG. 6 is a graph showing the characteristics of the FET having a gate length of 0.7 μm and a gate width of 20 μm according to this embodiment, and FIG. 7 is a graph showing the characteristics of the conventional FET having a gate length of 0.7 μm and a gate width of 20 μm shown in FIG. 5. The abscissa of each graph represents a gate voltage $V_G$ [V], and is graduated at 0.5000 V/div. The ordinate of each graph represents a drain current $I_D$ [mA] and a transconductance $g_m$ [mS]. The ordinate at the left side of each graph represents a drain current $I_D$ corresponding to a characteristic curve A, and is graduated at 1.000 mA/div. The ordinate at the right side of each graph represents a transconductance $g_m$ corresponding to a characteristic curve B, and is graduated at 25.00 mS/div.

The characteristic curve A in each graph represents a change in drain current $I_D$ as a function of a change in gate voltage $V_G$, and the characteristic curve B represents a change in transconductance $g_m$ a function of a change in gate voltage $V_G$. As can be understood from the characteristic curves A of these graphs, the drain current $I_D$ when the gate voltage $V_G$=0 V is about 7.7 mA in the FET of this embodiment shown in FIG. 6, while it is only about 6.7 mA in the conventional FET shown in FIG. 7. More specifically, the FET of this embodiment can obtain a high current output, and a high-output FET can be provided.

As can be understood from the characteristic curves B of the graphs, the transconductance $g_m$ when the gate voltage $V_G$=0 V is about 161 mS in the FET of this embodiment shown in FIG. 6, while it is only about 137 mS in the conventional FET shown in FIG. 7. More specifically, the FET of this embodiment can obtain a high gm. In addition, in the FET of this embodiment, a constant gm value is held over a wide range with respect to a change in gate voltage $V_G$. Therefore, in the FET of this embodiment, the $V_G$-gm characteristics are improved, and an FET with good high-frequency characteristics can be provided.

In the description of the above embodiment, the first and third channel layers 3 and 7 are formed to have a thickness of 80 Å, and the second channel layer 5 is formed to have a thickness of 70 Å. However, these channel layers need only be formed to have a thickness falling within a range from 50 to 150 Å. The first and second spacer layers 4 and 6 are formed to have a thickness of 50 Å. However, the thickness of these layers 4 and 6 need only fall within a range corresponding to a thickness as large as extension of a wave function of electrons, i.e., within a range from 50 to 200 Å. The capping layer 8 is formed to have a thickness of 400 Å. However, the thickness of the layer 8 need only fall within a range from 300 to 500 Å. When the semiconductor layers are formed to have the above-mentioned thicknesses, the same effect as in the above embodiment can be provided.

In the description of the above embodiment, the impurity concentrations of the first, second, and third channel layers 3, 5, and 7 are $3 \times 10^{18}$ [cm$^{-3}$]. However, these channel layers may be formed to have an impurity concentration falling within a range from $1 \times 10^{18}$ [cm$^{-3}$] to $5 \times 10^{18}$ [cm$^{-3}$]. In this case, the same effect as in the above embodiment can be obtained.

In the description of the above embodiment, three semiconductor layers are formed to constitute the channel layers. However, the number of layers is not limited to this, and three or more layers need only be formed. In this case, the same effect as in the above embodiment can be obtained.

In the description of the above embodiment, the channel layers 3, 5, and 7 are formed at equal intervals. Alternatively, by changing only the formation position, from the substrate surface, of the third channel layer 7 closest to the substrate surface, the influence of a surface depletion layer on the substrate deep portion may be eliminated. In this case, the same effect as in the above embodiment can be obtained.

Figure 8:
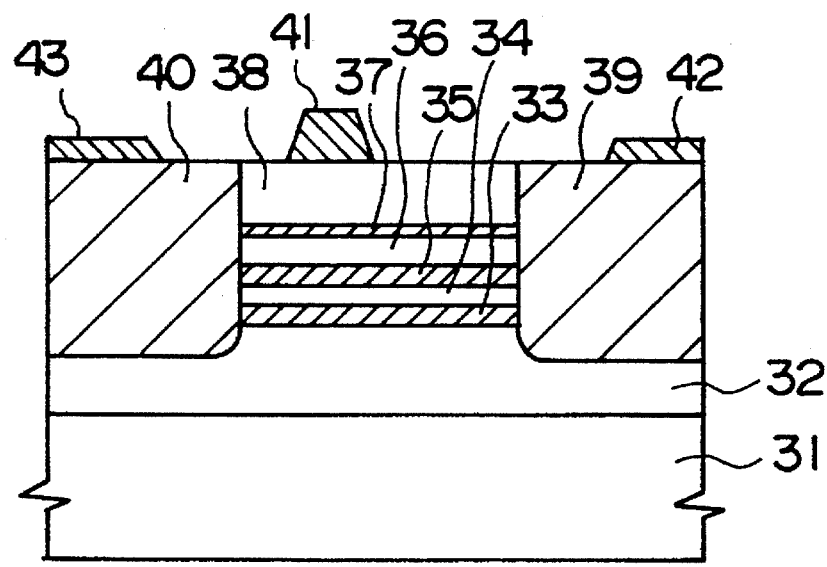
FIG. 8 is a sectional view showing the structure of an FET according to the second embodiment of the present invention.

FIG. 8 is a sectional view showing the structure of an FET according to the second embodiment of the present invention.

An undoped GaAs buffer layer 32 which is set to have p$^-$ background conductivity type is epitaxially grown on a semi-insulating GaAs semiconductor substrate 31. A first channel layer 33 as a first semiconductor layer, a first spacer layer 34, a second channel layer 35 as a second semiconductor layer, and a second spacer layer 36 are epitaxially grown on the buffer layer 32. Each of the first and second channel layers 33 and 35 consists of GaAs in which Si ions as an n-type impurity are doped at a high concentration, and its impurity concentration is set to be as high as $4 \times 10^{18}$ [cm$^{-3}$]. Note that the impurity concentration of each of these channel layers 33 and 35 is set to fall within a range from $1 \times 10^{18}$ [cm$^{-3}$] to $5 \times 10^{18}$ [cm$^{-3}$]. The thickness of each of the first and second channel layers 33 and 35 is set to be as small as 80 Å. Each of the first and second spacer layers 34 and 36 consists of undoped GaAs having n$^-$ background conductivity type, and its impurity concentration is set to be $1 \times 10^{15}$ [cm$^{-3}$] or less. The thickness of the first spacer layer 34 is set to be 50 Å, and that of the second spacer layer 36 is set to be 150 Å.

A doping layer 37 containing n-type Si ions as an impurity is formed on the second spacer layer 36. The impurity concentration and thickness of the doping layer 37 are set to be predetermined values which can prevent a surface depletion layer from extending to the channel layers 33 and 35, e.g., are respectively set to be $4 \times 10^{18}$ [cm$^{-3}$] and 50 Å. The impurity concentration of the doping layer 37 is set to fall within a range from $1 \times 10^{18}$ [cm$^{-3}$] to $5 \times 10^{18}$ [cm$^{-3}$], and its thickness is set to fall within a range from several tens of Å to 100 Å. Furthermore, a capping layer 38 is formed on the doping layer 37. The capping layer 38 consists of undoped GaAs having n$^-$ background conductivity type, and its impurity concentration is set to be $1 \times 10^{15}$ [cm$^{-3}$] or less.

An n$^+$-type drain region 39 and an n$^+$-type source region 40 doped with Si ions at a high concentration are formed to overlap the channel layers 33 and 35 and the doping layer 37. A gate electrode 41 is formed to ohmic-contact the capping layer 38. A drain electrode 42 and a source electrode 43 are formed to ohmic-contact the drain and source regions 39 and 40.

In the above-mentioned FET according to the second embodiment, even when a surface depletion layer is formed due to an interface level of the substrate surface on the side of the drain electrode 42, extension of the surface depletion layer to a deeper portion in the substrate is avoided since the doping layer 37 is formed to have the predetermined impurity concentration and thickness, as described above. The two channel layers, i.e., the second and first channel layers 35 and 33 are formed at substrate positions deeper than the doping layer 37. Therefore, a sufficient quantity of electrons for forming a current channel are assured by an impurity present in the second and first channel layers 35 and 33, and carriers are present with a high probability in the second and first spacer layers 36 and 34 which sandwich the channel layers 35 and 33 therebetween, and have good electron transfer characteristics. For this reason, according to this embodiment as well, a sufficiently high output current can be maintained without being influenced by the surface depletion layer. Since the doping layer 37 is depleted by the surface depletion layer, the insulating characteristics between the gate and drain are not impaired, and the drain withstand voltage can be improved.

In the description of each of the above embodiments, the semiconductor substrate 1 or 31 consists of GaAs. However, the present invention is not limited to this. For example, a semiconductor substrate consisting of, e.g., InP, InGaAs, or the like may be used. Si is used as an n-type impurity. However, Se, S, or the like may be used. When the FET is formed using these materials, the same effect as in the above embodiments can be obtained.

In the description of the above embodiment, three semiconductor layers are formed to constitute the channel layers. However, the number of layers is not limited to this, and three or more layers need only be formed. In this case, the same effect as in the above embodiment can be obtained.

Figure 9:
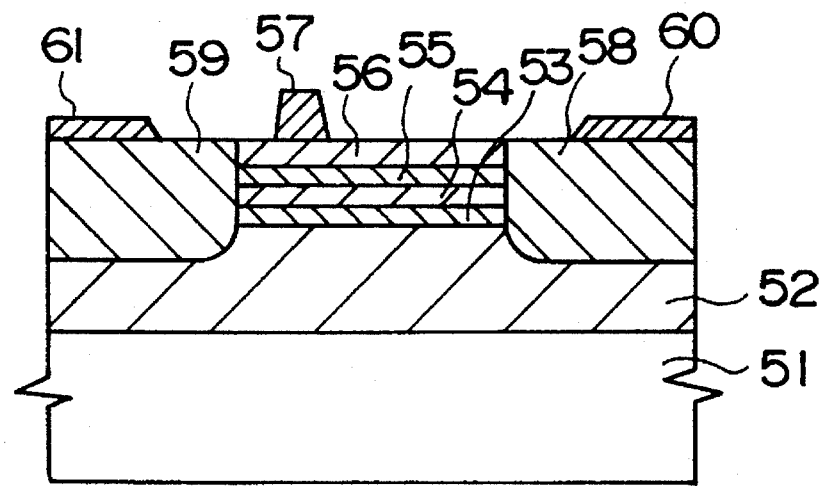
FIG. 9 is a sectional view showing the structure of an FET according to the third embodiment of the present invention.
Figure 10:
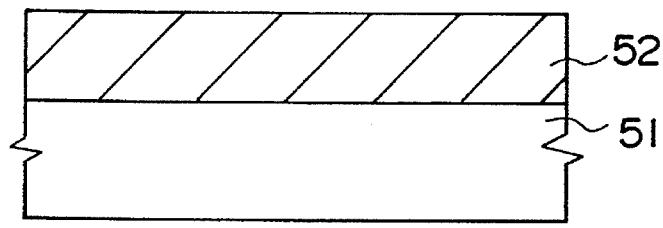
FIGS. 10 to 13 are sectional views showing the processes in the manufacture of the FET according to the third embodiment.
Figure 11:
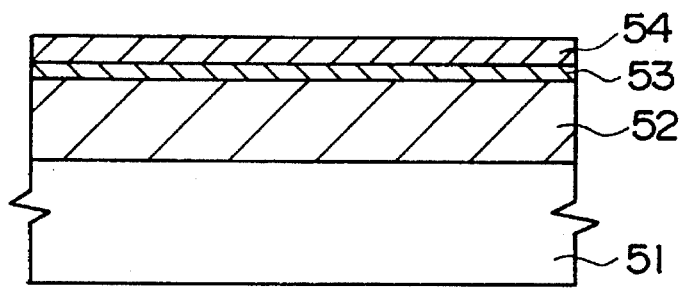
Figure 12:
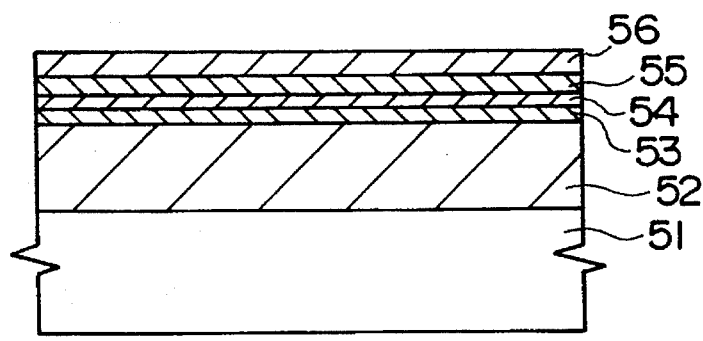
Figure 13:
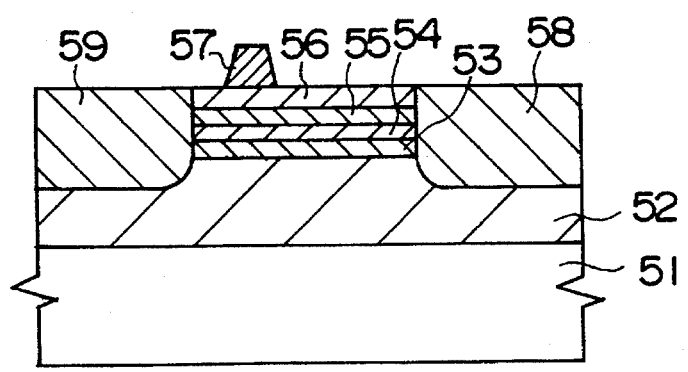

FIG. 9 is a sectional view showing the structure of an FET according to the third embodiment of the present invention. This FET is manufactured in accordance with the processes shown in the sectional views in FIGS. 10 to 13. The manufacturing method of the FET will be described below.

Semiconductor layers to be described below are sequentially deposited on a semi-insulating GaAs semiconductor substrate 51 using an epitaxy technique such as an MBE (Molecular Beam Epitaxy) method, an OMVPE (Organic Metal Vapor phase Epitaxy) method, or the like. An GaAs buffer layer 52 is epitaxially grown on the GaAs substrate 51 (see FIG. 10). This buffer layer 52 contains an p-type impurity at a concentration of about $1 \times 10^{16}$ [cm$^{-3}$]. The impurity concentration of the buffer layer 52 is suppressed to be as low as a maximum of $1 \times 10^{17}$ [cm$^{-3}$] or less.

An Si-doped GaAs layer is epitaxially grown on the buffer layer 52 to form a first channel layer 53 as a first semiconductor layer. The first channel layer 53 contains Si ions as an n-type impurity at a concentration as high as about 3 to $5 \times 10^{18}$ [cm$^{-3}$] or about 1 to $5 \times 10^{18}$ [cm$^{-3}$], and its thickness is set to be as small as 50 to 100 Å. A undoped intermediate concentration layer 54 is epitaxially grown on the first channel layer 53 to have a thickness of 100 to 500 Å (see FIG. 11). Since the intermediate concentration layer 54 is formed to be an undoped layer, its impurity concentration is very low in this state.

Then, an Si-doped GaAs layer is epitaxially grown on the intermediate concentration layer 54 to form a second channel layer 55 as a second semiconductor layer. The second channel layer 55 contains an Si impurity at a concentration as high as that of the first channel layer 53, and its thickness is as small as that of the first channel layer 53. Subsequently, an undoped GaAs layer is epitaxially grown on the second channel layer 55 to form a capping layer 56. The impurity concentration of the capping layer 56 is set to be very low as in the buffer layer 52 (see FIG. 12).

A source drain region pattern is formed on the substrate surface using a lithography technique, and high-concentration Si ions are selectively ion-implanted using this pattern as a mask. Upon this selective ion implantation, an $n^+$-type drain region 58 and an $n^+$-type source region 59 are formed. Then, the epitaxial wafer with the above-mentioned multi-layered structure is annealed at a temperature of 800° to 900° C. for 1 to 10 seconds. Thereafter, a gate electrode 57 is formed using a deposition technique, lithography technique, etching technique, and the like (see FIG. 13). The gate electrode 57 is formed at a position separated away from the drain region 58.

Finally, a drain electrode 60 and a source electrode 61, which ohmic-contact the drain and source regions 58 and 59 are formed using the same deposition technique, lithography technique, and the like. Upon formation of these electrodes, a Schottky contact type FET (MESFET) having the structure shown in FIG. 9 is completed.

Figure 14:
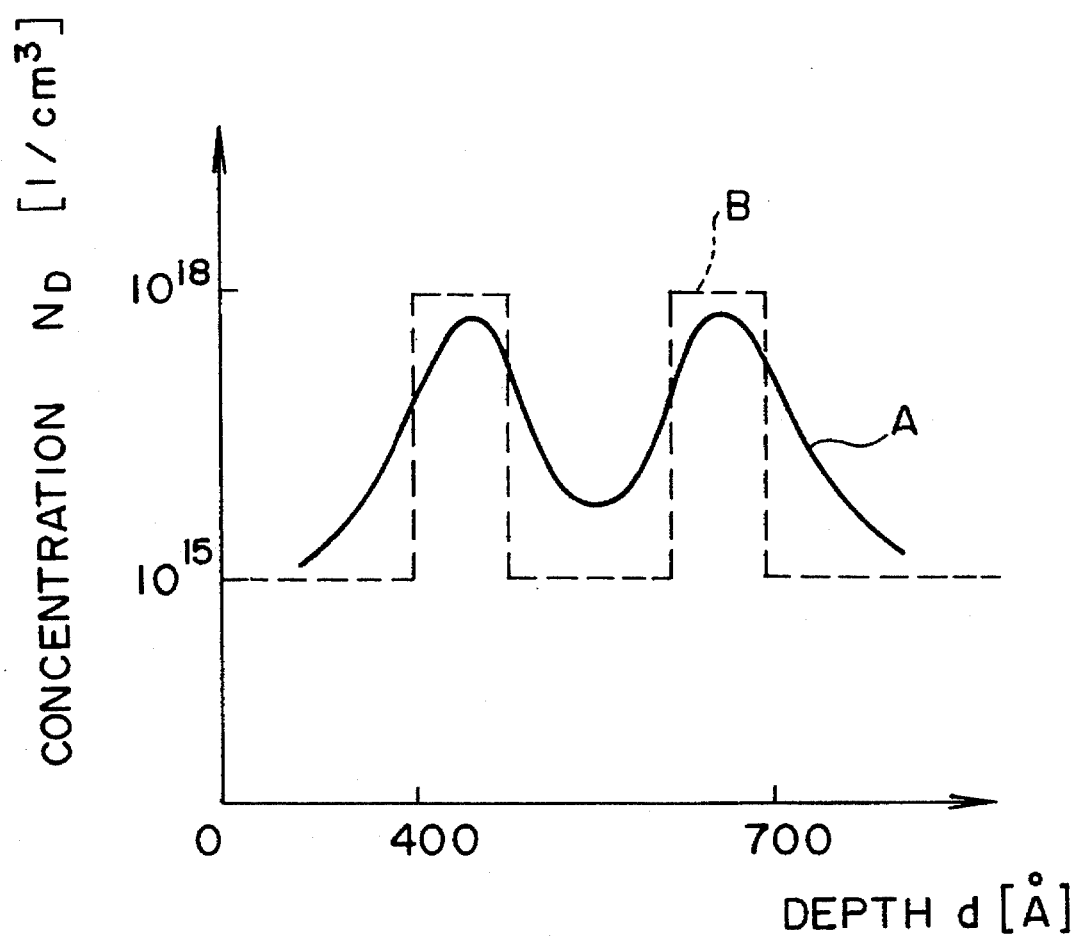
FIG. 14 is a graph showing the impurity profile below the gate electrode of the FET according to the third embodiment.

In this embodiment, since the above-mentioned annealing is performed after the layers 52 to 56 are epitaxially grown, the impurity profile below the gate electrode 57 where a current channel is formed is as shown in the graph in FIG. 14. The abscissa of the graph in FIG. 14 represents a depth d [μm] from the substrate surface, and the ordinate represents a concentration $N_D$ [cm$^{-3}$] of an n-type impurity, Si. An impurity profile A indicated by a solid curve represents the profile after annealing, and an impurity profile B indicated by a dotted curve represents the profile before annealing. The profile B before annealing includes high impurity concentration portions in a pulse pattern. A pulse-pattern portion on the substrate surface side corresponds to the second channel layer 55 which contains an impurity at a high concentration, and a pulse-pattern portion on the deep side of the substrate corresponds to the first channel layer 53 which contains an impurity at a high concentration. When the multi-layered structure having the above-mentioned impurity profile is annealed, Si ions contained in the channel layers 53 and 55 at a high concentration are diffused to the buffer layer 52, the intermediate concentration layer 54, and the capping layer 56, which sandwich the channel layers 53 and 55 therebetween. For this reason, the impurity profile pattern below the gate electrode changes from the stepwise pulse pattern to a relatively slow peak pattern, thus obtaining the impurity profile A shown in FIG. 14.

More specifically, the intermediate concentration layer 54 which is formed in an undoped state to be sandwiched between the channel layers 53 and 55 now contains an impurity at a concentration of about $1 \times 10^{17}$ [cm$^{-3}$]. The impurity concentration of the intermediate concentration layer 54 is set to be lower than the impurity concentration of 3 to $5 \times 10^{18}$ [cm$^{-3}$] or 1 to $5 \times 10^{18}$ [cm$^{-3}$] of the first and second channel layers 53 and 55. The impurity contained in the channel layers 53 and 55 is also diffused to the buffer layer 52 and the capping layer 56, which sandwich the channel layers 53 and 55 at the outermost sides, and channel layer contact portions of the two outermost layers contain an impurity at a concentration lower than the impurity concentration of the channel layers 53 and 55.

Therefore, in the MESFET with the above-mentioned structure according to this embodiment, since the buffer layer 52, the intermediate concentration layer 54, and the capping layer 56 which sandwich the channel layers 53 and 55 therebetween contain an impurity at a low concentration, channel electrons are generated by the impurity Si present in these layers 52, 54, and 56. Therefore, electrons for forming a current channel are distributed to the layers 52, 54, and 56, which sandwich the channel layers 53 and 55 therebetween, in a low-electric field region, i.e., on the source side at which an electric field lower than that on the drain side is formed. For this reason, the channel electrons move in these layers 52, 54, and 56 having a low impurity concentration than the channel layers 53 and 55, and the influence of impurity scattering is eliminated. As a result, the electron mobility in the low-electric field region on the source side is improved.

On the drain side at which a high electric field is formed, electrons which move in the channel layers 53 and 55 receive energy from the high electric field to have a higher energy level. Therefore, channel electrons leave the channel layers 53 and 55 having a high impurity concentration, and move in the buffer layer 52, the intermediate concentration layer 54, and the capping layer 56, which sandwich the channel layers 53 and 55 therebetween, and have a low impurity concentration. For this reason, in the high-electric field region in the drain side, the influence of impurity scattering on channel electrons is eliminated, and the electron saturation rate can be prevented from being decreased.

Therefore, according to the FET of this embodiment, the electron mobility can be increased over the entire channel from the source side to the drain side. Also, the electron saturation rate is not impaired. For this reason, the high-frequency characteristics of an element can be improved. The transconductance gm of the FET is held to be a constant value over a given range with respect to a change in gate voltage, and a change in transconductance gm with respect to a change in gate voltage exhibits flat characteristics.

In the description of the third embodiment, an impurity in the channel layers 53 and 55 is diffused to the undoped semiconductor layer by annealing, thereby forming the intermediate concentration layer 54. Alternatively, the intermediate concentration layer 54 may be formed as follows. That is, when semiconductor layers to be deposited on the semiconductor substrate 51 are epitaxially grown, an intermediate concentration layer which properly contains an impurity may be formed by controlling the concentrations of impurities contained in materials. Also, layers corresponding to the buffer layer and the capping layer may be formed to properly contain an impurity like in the above embodiment. With this manufacturing method and structure, the same effect as in the above embodiment can be obtained. That is, the mobility of channel electrons can be improved, and a high electron saturation rate can be maintained.

In the description of the third embodiment, the semiconductor substrate 51 consists of GaAs. However, the present invention is not limited to this. For example, a semiconductor substrate consisting of, e.g., InP, InGaAs, or the like may be used. Si is used as an n-type impurity. However, Se, S, or the like may be used. When the FET is formed using these materials, the same effect as in the above embodiments can be obtained.

In the description of each of the above embodiments, the gate electrode 11, 41, or 57 is formed at a position separated away from the drain electrode 12, 42, or 60 to obtain an FET with improved withstand voltage characteristics between the gate and drain. However, the present invention is not limited to this. More specifically, each of the above embodiments may be applied to an FET with a structure in which the gate electrode is formed at the center between the drain and source, an FET with a structure in which the gate electrode is formed in a recess, and the like, and the same effect as in each of the above embodiments can be obtained with these FETs.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A field effect transistor comprising:

at least three channel layers, each of said channel layers having an impurity concentration of $1\times10^{18}$ ($cm^{-3}$) to $5\times10^{18}$ ($cm^{-3}$); and undoped layers arranged between said channel layers, each of said undoped layers having an impurity concentration of not more than $5\times10^{15}$ ($cm^{-3}$), wherein each of said channel layers has a thickness of 50 to 150 Å, and each of said undoped layers has a thickness of 50 to 200 Å.

2. A field effect transistor according to claim 1, wherein said channel layers and said undoped layers are formed by an epitaxy method.

3. A field effect transistor according to claim 2, further comprising:

a semiconductor substrate; and a buffer layer arranged between said semiconductor substrate and one of said channel layers, wherein said semiconductor substrate consists of a compound semiconductor material selected from the group consisting of GaAs, InP, and InGaAs.

4. A field effect transistor according to claim 3, wherein each of said channel layers includes an n-type dopant selected from the group consisting of Si, Se and S.

5. A field effect transistor according to claim 4, further comprising:

a capping layer formed on one of said channel layers;

a gate electrode formed on said capping layer;

a source region being in contact with said channel layers;

a drain region being in contact with said channel layers;

a source electrode formed on said source region; and a drain electrode formed on said drain region, wherein an interval between said gate and drain electrodes is larger than an interval between said gate and source electrodes.

6. A field effect transistor comprising:

at least two channel layers, each of said channel layers having an impurity concentration of $1\times10^{18}$ ($cm^{-3}$) to $5\times10^{18}$ ($cm^{-3}$); and intermediate concentration layers arranged between said channel layers, each of said intermediate concentration layers having an impurity concentration of approximately $10^{17}$ ($cm^{-3}$).

7. A field effect transistor according to claim 6, wherein each of said channel layers has a thickness of 50 to 150 Å, and each of said intermediate concentration layers has a thickness of 50 to 200 Å.

8. A field effect transistor according to claim 7, wherein said channel layers and said intermediate concentration layers are formed by an epitaxy method.

9. A field effect transistor according to claim 8, further comprising:

a semiconductor substrate; and a buffer layer arranged between said semiconductor substrate and one of said channel layers, wherein said semiconductor substrate consists of a compound semiconductor material selected from the group consisting of GaAs, InP, InGaAs.

10. A field effect transistor according to claim 9, wherein each of said channel layers includes an n-type impurity selected from the group consisting of Si, Se and S.

11. A field effect transistor according to claim 10, further comprising:

a capping layer formed on one of said channel layers;

a gate electrode formed on said capping layer;

a source region being in contact with said channel layers;

a drain region being in contact with said channel layers;

a source electrode formed on said source region; and a drain electrode formed on said drain region, wherein an interval between said gate and drain electrodes is larger than an interval between said gate and source electrodes.

12. A field effect transistor according to claim 6, wherein said intermediate concentration layer is formed by diffusing an impurity from said channel layers into an undoped layer arranged between said channel layers.

13. A field effect transistor according to claim 6, wherein said intermediate concentration layer is formed by an epitaxy method.

* * * * *